(12) United States Patent
Shmueli

(10) Patent No.: US 11,126,641 B2
(45) Date of Patent: Sep. 21, 2021

(54) OPTIMIZED DATA DISTRIBUTION SYSTEM

(71) Applicant: TECHNION RESEARCH & DEVELOPMENT FOUNDATION LIMITED, Haifa (IL)

(72) Inventor: Oded Shmueli, Nofit (IL)

(73) Assignee: TECHNION RESEARCH & DEVELOPMENT FOUNDATION LIMITED, Haifa (IL)

(*) Notice: Subject to any disclaimer, the term of this patent is extended or adjusted under 35 U.S.C. 154(b) by 334 days.

(21) Appl. No.: 15/999,450

(22) PCT Filed: Feb. 16, 2017

(86) PCT No.: PCT/IL2017/050205
§ 371 (c)(1),
(2) Date: Aug. 16, 2018

(87) PCT Pub. No.: WO2017/141249
PCT Pub. Date: Aug. 24, 2017

(65) Prior Publication Data
US 2019/0251097 A1    Aug. 15, 2019

Related U.S. Application Data

(60) Provisional application No. 62/295,526, filed on Feb. 16, 2016, provisional application No. 62/360,507, filed on Jul. 11, 2016.

(51) Int. Cl.
*G06F 16/00* (2019.01)
*G06F 16/27* (2019.01)
(Continued)

(52) U.S. Cl.
CPC .......... *G06F 16/278* (2019.01); *G06F 3/0605* (2013.01); *G06F 3/067* (2013.01);
(Continued)

(58) Field of Classification Search
CPC .... G06F 16/214; G06F 16/278; G06F 16/285; G06F 16/00; G06F 12/0891;
(Continued)

(56) References Cited

U.S. PATENT DOCUMENTS 6,505,227 B1   1/2003  Mirchandaney et al.
8,346,739 B1   1/2013  Hatton et al.
(Continued)

FOREIGN PATENT DOCUMENTS

CN       105227630 A     1/2016

OTHER PUBLICATIONS

Philip A. Bernstein et al: "Concurrency Control and Recovery in Database Systems"; Concurrency control and recovery in database systems; Addison-Wesley Longman Publishing Co., Inc. Boston, MA, USA, 1987; pp. 265-311; ISBN:0-201-10715-5.
(Continued)

*Primary Examiner* — Anh Ly
(74) *Attorney, Agent, or Firm* — The Roy Gross Law Firm, LLC; Roy Gross

(57) ABSTRACT

A method comprising using one or more hardware processors for automatically receiving two or more data objects and two or more data storage addresses, wherein each data storage address directs to one of two or more non-transitory computer readable storage medium locations. The method comprises the action of computing two or more parameter values for each of the data objects. The method comprises the action of grouping the data objects based on the parameter values and two or more predefined rules, thereby producing two or more groups. The method comprises the action of assigning each of the groups to one of the data storage addresses based on the predefined rules. The method comprises the action of storing each of the objects of the (Continued)

groups at one of the non-transitory computer readable storage medium locations based on the assigning.

17 Claims, 3 Drawing Sheets

(51) Int. Cl.
  *G06F 3/06* (2006.01)
  *G06F 9/50* (2006.01)
  *G06F 9/52* (2006.01)
  *G11C 8/00* (2006.01)
  *G06F 16/28* (2019.01)
  *G06F 16/21* (2019.01)
(52) U.S. Cl.
  CPC .......... *G06F 3/0649* (2013.01); *G06F 3/0685* (2013.01); *G06F 9/5066* (2013.01); *G06F 9/52* (2013.01); *G06F 16/214* (2019.01); *G06F 16/285* (2019.01); *G11C 8/00* (2013.01)
(58) Field of Classification Search
  CPC ...... G06F 3/0605; G06F 3/0649; G06F 3/067; G06F 3/0685; G06F 9/5066; G06F 9/52; G06F 17/00; H04N 21/472; H04N 21/6543; H04N 21/482; H04N 21/262; H04N 21/4888; H04N 21/4147; G11C 8/00; G11C 11/407; G11C 11/413; G06G 17/30
  See application file for complete search history.

(56) References Cited

U.S. PATENT DOCUMENTS

| | | | | |
|---|---|---|---|---|
| 2005/0125487 | A1* | 6/2005 | O'Connor | H04M 3/5237 709/201 |
| 2006/0195845 | A1* | 8/2006 | Rhine | G06F 9/4881 718/102 |
| 2008/0062886 | A1* | 3/2008 | Tang | H04L 47/70 370/252 |
| 2010/0211412 | A1* | 8/2010 | Tholl | G06Q 40/08 705/4 |
| 2011/0078372 | A1 | 3/2011 | Gladwin et al. | |
| 2012/0233668 | A1* | 9/2012 | Leafe | G06F 9/00 726/4 |
| 2013/0074058 | A1* | 3/2013 | Gounares | G06F 11/3428 717/153 |
| 2013/0085882 | A1* | 4/2013 | Gounares | G06F 9/44505 705/26.1 |
| 2014/0206361 | A1* | 7/2014 | Centonza | H04W 36/24 455/444 |
| 2014/0324920 | A1 | 10/2014 | Hamilton | |
| 2015/0088940 | A1* | 3/2015 | Stokely | G06F 3/0617 707/827 |
| 2015/0278397 | A1* | 10/2015 | Hendrickson | G06F 16/9024 707/798 |
| 2015/0319051 | A1* | 11/2015 | Gordon | H04L 43/0817 709/217 |
| 2016/0260121 | A1* | 9/2016 | Wood | G06Q 30/0243 |
| 2017/0279481 | A1* | 9/2017 | Rossl | G08C 19/00 |

OTHER PUBLICATIONS

Divy Agrawal et al: "A Taxonomy of Partitioned Replicated Cloud-based Database Systems"; IEEE Data Eng. Bull.; 2015; vol. 38; pp. 4-9.

International Search Report PCT/IL2017/050205 Completed May 8, 2017; dated May 11, 2017 6 pages.

Written Opinion of the International Searching Authority PCT/IL2017/050205 dated May 11, 2017 6 pages.

* cited by examiner

Supplementary Sheet

| Group | S | U | R | F |
|---|---|---|---|---|
| 1 | L,M,H | L,M,H | L,M,H | L,M |
| 2 | L,M,H | L,M,H | L,M,H | H |

FIG. 3

| Group | S | U | R | F |
|---|---|---|---|---|
| 1 | L | L,M | L | L,M,H |
| 2 | L | L,M | M | L,M,H |
| 3 | L | L,M | H | L,M,H |
| 4 | L | H | L,M,H | L,M,H |
| 5 | M | L | L,M | L,M |
| 6 | M | M | L,M | L,M |
| 7 | M | H | L,M | L,M |
| 8 | M | H | H | L,M |
| 9 | M | L | L,M | H |
| 10 | M | M | L,M | H |
| 11 | M | H | L,M | H |
| 12 | M | H | H | H |
| 13 | H | L,M | L,M,H | L |
| 14 | H | L,M | L,M,H | M |
| 15 | H | L,M | L,M,H | H |
| 16 | H | H | L,M,H | L |
| 17 | H | H | L,M,H | M |
| 18 | H | H | L,M,H | H |

FIG. 4

OPTIMIZED DATA DISTRIBUTION SYSTEM

PRIORITY

This application is a National Phase of PCT Patent Application No. PCT/IL2017/050205 having International filing date of Feb. 16, 2017, which claims the benefit of priority to U.S. Provisional Patent Application No. 62/295,526, filed Feb. 16, 2016, entitled "SURF—Optimized Data Distribution System" and U.S. Provisional Patent Application No. 62/360,507, filed Jul. 11, 2016, entitled "SURF—Optimized Data Distribution System", the contents of which are incorporated herein by reference in their entirety.

BACKGROUND

The invention relates to the field of distributed computer data storage and applications placement.

Databases may reside in a multitude of locations: servers in various company-controlled locations, internal corporate clouds, public clouds, and/or the like. The selection of locations for data placement in the various locations may be complex and dynamic.

Database objects (also referred to as records, files, blocks and/or the like) have different requirements regarding the accessibility, security, and/or the like, which may affect the choice of storage location, such as specified by a storage location address.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a method comprising using one or more hardware processors for automatically receiving two or more data objects and two or more data storage addresses, wherein each data storage address directs to one of two or more non-transitory computer readable storage medium locations. The method comprises the action of computing two or more parameter values for each of the data objects. The method comprises the action of grouping the data objects based on the parameter values and two or more predefined rules, thereby producing two or more groups. The method comprises the action of assigning each of the groups to one of the data storage addresses based on the predefined rules. The method comprises the action of storing each of the objects of the groups at one of the non-transitory computer readable storage medium locations based on the assigning.

In some embodiments, the method further comprises receiving two or more user parameter values from a user interface of a client terminal, wherein the user parameter values are assigned to the data objects, and wherein the grouping is further based on the user entered parameter values.

In some embodiments, the method further comprises monitoring the values of the data objects and characteristics of the local and cloud-based locations for a system parameter-exceeding change, and when the change is detected repeating the steps of computing, grouping, assigning, and storing.

In some embodiments, the method further comprises monitoring the values of the data objects for a change, and when the change is detected repeating the steps of computing, grouping, assigning, and storing.

In some embodiments, the parameter values are associated with the data objects based on interaction between users and the data objects.

In some embodiments, one or more of the data objects is replicated to two or more of the non-transitory computer readable storage medium locations.

In some embodiments, the method further comprises assigning each of the groups to one of the data storage addresses based on a financial cost of storage at the respective data storage address.

In some embodiments, the grouping is based on a k-means clustering of the parameter values.

In some embodiments, each of the data objects is represented by a tuple in a relational database.

In some embodiments, the computing of the parameters is expressed by rules.

In some embodiments, the grouping is expressed by rules.

In some embodiments, the rules are expressed by SQL queries.

In some embodiments, the assigning of each of the groups is according to a multi-objective policy expressed via a Goal Program.

In some embodiments, the Goal Program utilizes group-associated values and variables.

In some embodiments, the storing of each of the data objects is performed in parallel to regular system activity.

In some embodiments, a locking mechanism on tuple is employed to control the storing of some of the data objects to new locations.

In some embodiments, the assignment of the data objects is performed periodically.

In some embodiments, the assignment is conditioned on comparing one or more of the parameter values to one or more corresponding threshold value.

There is provided, in accordance with an embodiment, a system comprising one or more hardware processors, and a processor-attached non-transitory computer-readable storage medium having program code embodied therewith. The program code executable by the hardware processor(s) to receive two or more data objects and two or more data storage addresses, wherein each data storage address directs to one of two or more non-transitory computer readable storage medium locations. The program code executable by the hardware processor(s) to compute two or more parameter values for each of the objects. The program code executable by the hardware processor(s) to group the data objects based on the parameter values and two or more predefined rules, thereby producing two or more groups. The program code executable by the hardware processor(s) to assign each of the groups to one of the data storage addresses based on the predefined rules. The program code executable by the hardware processor(s) to store each of the objects of the groups at one of the non-transitory computer readable storage medium locations based on the assigning.

In some embodiments, the system further comprises program code executable by the hardware processor(s) to receive two or more user parameter values from a user interface of a client terminal, wherein the user parameter values are assigned to the data objects, and wherein the grouping is further based on the user entered parameter values.

In some embodiments, the system further comprises program code executable by the hardware processor(s) to monitor the values of the data objects and characteristics of the local and cloud-based locations for a system parameter-exceeding change, and when the change is detected repeating the steps of computing, grouping, assigning, and storing.

In some embodiments, the system further comprises program code executable by the hardware processor(s) to monitor the values of the data objects for a change, and when the change is detected repeating the steps of computing, grouping, assigning, and storing.

In some embodiments, the parameter values are associated with the data objects based on interaction between users and the data objects.

In some embodiments, one or more of the data objects is replicated to two or more of the non-transitory computer readable storage medium locations.

In some embodiments, the system further comprises assigning each of the groups to one of the data storage addresses based on a financial cost of storage at the respective data storage address.

In some embodiments, the grouping is based on a k-means clustering of the parameter values.

In some embodiments, each of the data objects is represented by a tuple in a relational database.

In some embodiments, the computing of the parameters is expressed by rules.

In some embodiments, the grouping is expressed by rules.

In some embodiments, the rules are expressed by SQL queries.

In some embodiments, the rules are expressed by SQL queries.

In some embodiments, the assigning of each of the groups is according to a multi-objective policy expressed via a Goal Program.

In some embodiments, a Goal Program utilizes group-associated values and variables.

In some embodiments, the storing of each of the data objects is performed in parallel to regular system activity.

In some embodiments, a locking mechanism on tuple is employed to control the storing of some of the data objects to new locations.

In some embodiments, the assignment of the data objects is performed periodically.

In some embodiments, the assignment is conditioned on comparing one or more of the parameter values to one or more corresponding threshold value.

There is provided, in accordance with an embodiment, a computer program product, the computer program product comprising a processor-attached non-transitory computer-readable storage medium having the program code embodied therewith.

In some embodiments, the computer program product further comprises program code executable by the hardware processor(s) to receive two or more user parameter values from a user interface of a client terminal, wherein the user parameter values are assigned to the data objects, and wherein the grouping is further based on the user entered parameter values.

In some embodiments, the computer program product further comprises program code executable by the hardware processor(s) to monitor the values of the data objects and characteristics of the local and cloud-based locations for a system parameter-exceeding change, and when the change is detected repeating the steps of computing, grouping, assigning, and storing.

In some embodiments, the computer program product further comprises program code executable by the hardware processor(s) to monitor the values of the data objects for a change, and when the change is detected repeating the steps of computing, grouping, assigning, and storing.

In some embodiments, the computer program product further comprises assigning each of the groups to one of the data storage addresses based on a financial cost of storage at the respective data storage address.

There is provided, in accordance with an embodiment, a method comprising running two or more clone instances of an identical application, each of the clone instances at one of two or more hardware processors. The method comprises an action of sharing program states between the hardware processors, such that the clone instances are effectively executing the same processor instruction of a program code defining the identical application. The method comprises an action of selecting one of the clone instances for accessing data, wherein the selected clone instance comprises a fastest, least expensive, and/or closest access to at least one data object. The method comprises an action of executing one or more processor instructions by the selected clone instance to access the one or more of the data objects. The method comprises an action of sharing the results of the executing between the hardware processors.

There is provided, in accordance with an embodiment, a system comprising two or more hardware processors, and two or more storage locations. Each storage location comprising one or more of two or more non-transitory computer readable mediums, wherein the non-transitory computer readable mediums comprise two or more data objects. One or more of the non-transitory computer readable mediums comprises program code executable on the hardware processors. The program code is configured to run two or more clone instances of an identical application defined by the program code, each of the clone instances at one of the hardware processors. The program code is configured to share program states between the hardware processors, such that the clone instances are effectively executing the same processor instruction of the program code. The program code is configured to select one of the clone instances for accessing data, wherein the selected clone instance comprises a fastest, least expensive, and/or closest access to one or more of the data objects. The program code is configured to execute one or more processor instruction by the selected clone instance to access the one or more of the data objects. The program code is configured to share the results of the executing between the hardware processors.

There is provided, in accordance with an embodiment, a computer program product, the computer program product comprising a processor-attached non-transitory computer-readable storage medium having program code embodied therewith. The program code executable by two or more hardware processors to run two or more clone instances of an identical application defined by the program code, each of the clone instances at one of the hardware processors. The program code executable by two or more hardware processors to share program states between the hardware processors, such that the clone instances are effectively executing the same processor instruction of the program code. The program code executable by two or more hardware processors to select one of the clone instances for accessing data, wherein the selected clone instance comprises a fastest, least expensive, and/or closest access to one or more of two or more data objects. The program code executable by two or more hardware processors to execute one or more processor instructions by the selected clone instance to access the at least one of the data objects. The program code executable by two or more hardware processors to share the results of the executing between the hardware processors.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIG. 3 shows a table presenting parameters associated with two groups of objects; and FIG. 4 shows a table presenting parameters associated with 18 groups of objects

DETAILED DESCRIPTION

Described herein are systems and methods that may (a) determine and/or perform initial data placement, and (b) respond to dynamic changes by suggesting and/or performing data storage location changes. The techniques may be versatile and support a multitude of data objects (flat files, hierarchical files, tables, columns, documents, graphs, etc.). The techniques may easily support data access in other systems and present an easy to use and simple programming interface. The techniques may also support a user interface and provide tracking and recovery facilities.

Among the factors affecting the determination of where to put which data may be: the sensitivity (or security) and privacy of the data, how important quick access may be to the data (urgency) and from where, how important data availability may be in case of communication delays which in turn may determine the degree of replication, and how frequent the data access may be and in which mode (read, write, append, insert, delete, etc.). As used herein the term SURF parameter(s) refers to these parameters and other access parameters that may be used to determine the user needs in accessing individual data elements of the database, such as data blocks.

In addition, other factors, such as technical factors (data size, installation capacity, communication speed, bandwidth, etc.), economic parameters such as cost of storage/services, and the like, may affect the determination. For example, all these parameters and factors are subject to continuous change.

To optimize between the data access needs of the users and the storage location resources available, the data blocks may be organized into groups, and the groups together with a policy, such as a set of rules, defining the access needs to the groups may be inputted into an optimization solver. The solver determines the optimal distribution of the database among the storage locations, such as specified by a storage location addresses. Optionally, the computing of the parameters, groups, and/or the like, are expressed by rules. Optionally, the rules are expressed by SQL queries.

Figure 1:
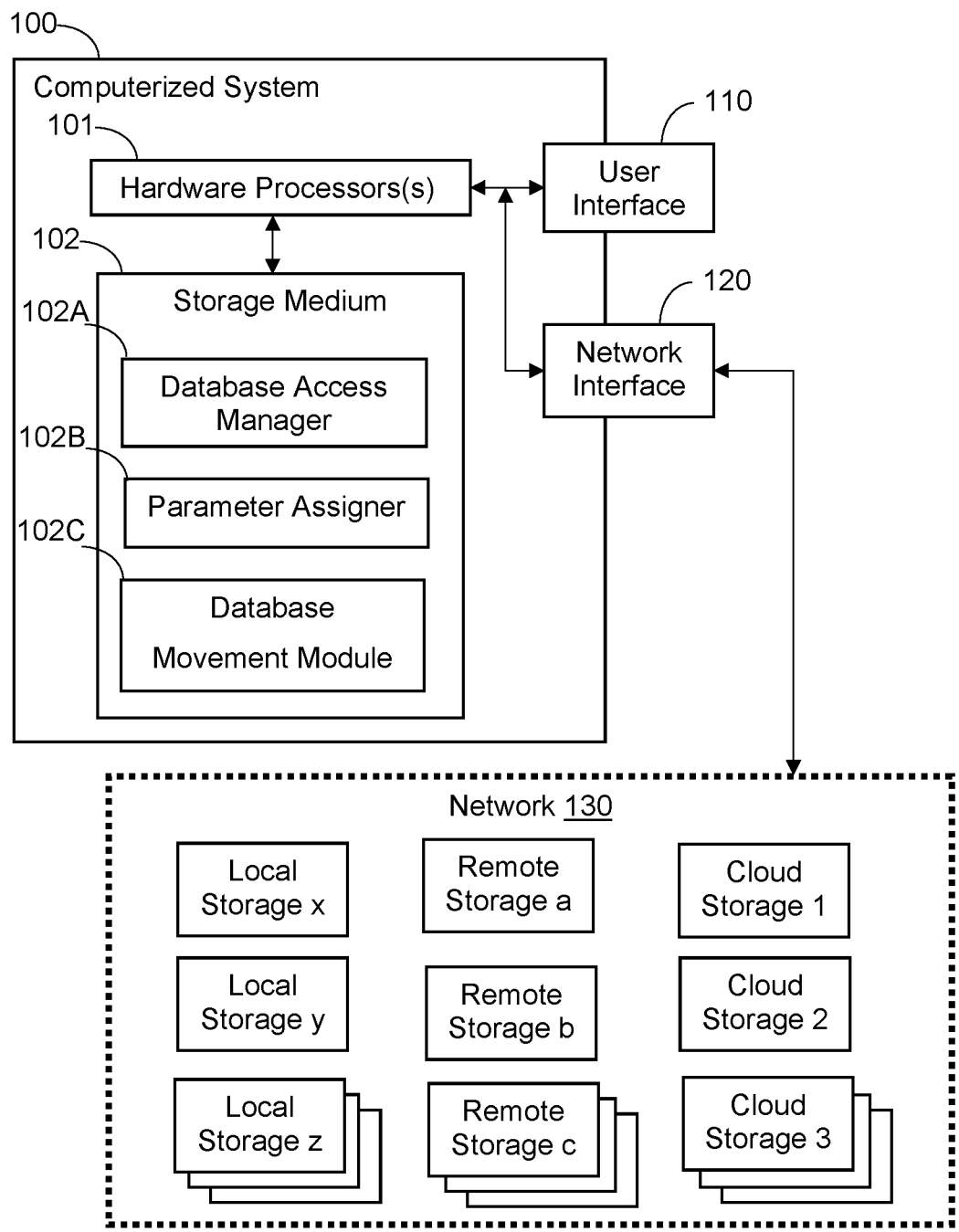
FIG. 1 shows schematically a system for optimized data distribution.

Reference is now made to FIG. 1, which shows schematically a system 100 for optimized data distribution. System 100 comprises one or more hardware processors 101, a user interface 110, a network interface 120, a storage medium 102, and/or the like. Storage medium 102, such as a non-transitory computer readable storage medium, comprises modules for optimizing data distribution. A database access manager module 102A comprises processor instructions configured for receiving a database, two or more network 130 storage location addresses, user inputted parameters, and/or the like. A parameter assigner module 102B comprises processor instructions configured for computing parameter values of data objects/records/fields of the database, such as based on:

security considerations, such as based on privacy settings,
urgency considerations, such as when a data field may be determined by the processor to be a bottleneck in an SQL query,
replication considerations, such as based on historical access to the data fields from different user terminals,
frequency considerations, such as based on access per second, access per second of different types, etc.,
and/or the like.

A database movement module 102C comprises processor instructions configured to assign data fields to locations based on the parameters, store the fields at the locations, and/or the like. These modules perform an initial optimization in addition to repeated optimizations while the database is in use. Data access manager 102A may comprise processor instructions configured to facilitate data access by executing application programs, coordinating accesses with data movement, tracking accesses (such as for computing parameters), collecting statistics for dynamically re-running data storage locations assignment, and/or the like. Optionally, a data mapper (not shown) may enable corporate IT to easily associate parameter values to files, portions of files, relations, portions of relations, based on the rules and functions (e.g., "all City='Haifa' records). Access parameters may allow data placement and location determination. The access parameters may each stand for several distinct related parameters. Network 130 storage locations, such as specified by a storage location addresses, may comprise:

local storage, such as x, y, and z, (memory, disk, NAS, etc.)
remote storage, such as a, b, and c (other servers, private corporate storage arrays, etc.), and
cloud storage, such as 1, 2, and 3.

There may be more than one cloud installation (also referred to as a data center) and more than one corporate installation, each with its access parameters. Examples may comprise one cloud installation and one corporate installation, but it is known that such installations may be replicated partially or fully, that is objects may reside exclusively in one of the installations or in both. Also within a single installation data objects may be replicated.

Figure 2:
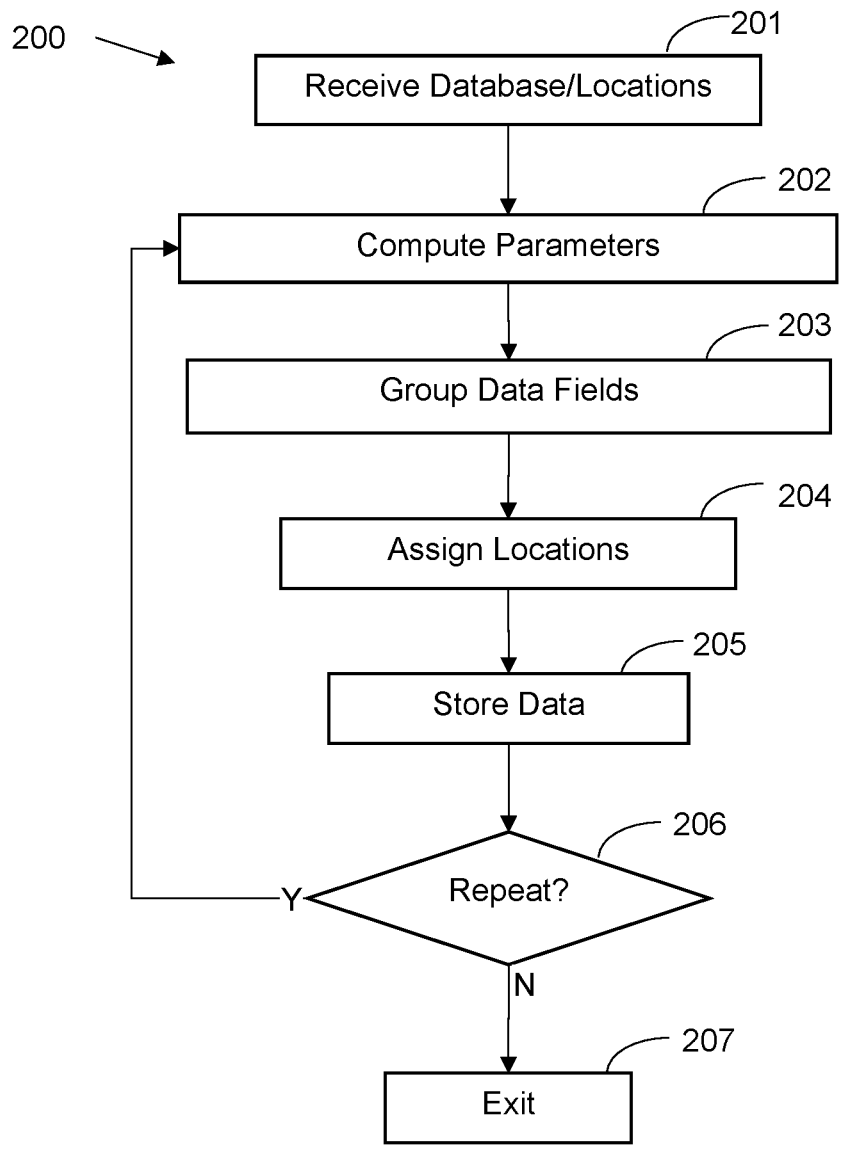
FIG. 2 shows a flowchart of a method for optimized data distribution.

Reference is now made to FIG. 2, which shows a flowchart of a method 200 for optimized data distribution. A database and storage locations may be received 201, where database comprises multiple objects, data records, data fields, values, and/or the like. For each record and/or field of the database, parameters may be computed 202 that relate to the access of the data, such as an access security parameter of each data field, an access urgency parameter of each field, an access replication parameter of each field, an access frequency parameter of each field, and/or the like. These access parameters may be also called SURF (security, urgency, replication, frequency, etc.) parameters through this application, but are not limited to the above examples. The data objects and/or records may be grouped 203 into clusters of parameters that conform to similar access requirements. Optionally, the grouping is based on a k-means clustering of the parameter values. An access policy, such as group-based goal program expressed policies comprises two or more rules, may be used to assign 204 each group to one of the storage locations, and the corresponding database elements may be stored 205 in the respective locations. The process may be repeated 206 starting from the action of computing 202 parameters at intervals, such as at time intervals, at data volume intervals, at security review intervals, at manual intervals, and/or the like. When not repeated 206, the process may be exited 207 although in most embodiments executing 207 may not be likely.

The techniques disclosed may differentiate between a local corporate site and cloud Data Centers (for example, security is highest on the local site). Efficient computation of storage locations corresponding to policies may be performed by creating groups of data objects based on characteristics (manually or automatically, such as using clustering) so as to place and replicate them together. Balancing of deviations from distinct objectives may be performed using goal program policies. Rules (such as expressed via SQL) for assigning parameters to data objects assist in the grouping of the data objects/blocks. Optionally, the assignment is conditioned on comparing one or more of the parameter values to one or more corresponding threshold value. Optionally, a system may generate data mappings. For example:

Groups may make a system manageable both in operation and in optimization (i.e. too many variables may often cause optimizers to fail).
  Using Goal Program Policies allow balancing the various performance targets, which may often oppose each other.
  Local corporate storage sites may be considered more secure.
  Our data re-placement algorithms (simple and improved) enable continuous system operation despite data movements.
  Access parameters (such as S, U, R parameters) may be assigned to objects based on rules that may be expressed in SQL (Structured Query Language; an industry standard data definition, querying and manipulation language).
  Groups may be defined via rules (and also have an option of using clustering, possibly translated into rules). Rules may be expressed in SQL.
  Options may be provided to change the constituents of groups (i.e. their tuples where each tuple represents a data object) based on proximity of access monitoring to objects.
  an application (app) may run in two (or more) places where it has 'incarnations' that access the data locally at those places and exchange between (or among) them values of app program variables so that these programs are in the same program state.
  monitoring accesses to objects may be economical by probabilistically recording the access (less expensive than updating an access count after each access).
  Following are example aspects of embodiments.

For example, storage placement of data items may be on: one or more corporate servers, one or more cloud installations, one or more local repositories, and/or the like. Data may reside in a combination of storage types, in several replicas, and/or the like. For example, the number of replicas and their storage location may be determined by access parameters.

Optionally, accesses to data, such as at the block level, field level, record level, or the like, are continuously monitored. For example, monitoring is done by recording each access with a probability value, such as $0<p<1$, e.g. $p=0.15$, and ensuring a low overhead. When time goes by, the initial data access parameters may be recomputed to allow the system to partition a file into sub-files, such as of similar access frequency, and handle these data blocks separately. For example, monitoring is in addition to other techniques that reorganizes data blocks (e.g., a B+ tree, a PIXAR scheme, etc.). For example, a "new" block receives a weighted average of the accesses historically made to its data object constituents. For example, new blocks may be assigned default average values that are dynamically adjusted later.

Optionally, a data access policy is expressed as a Goal Program Policy (GPP). A GPP may comprise (1) a set of constraints, (2) a set of goals indicating desired access targets, (3) a set of rules, and/or (4) a set of objective access functions, organized in levels of importance. Optionally, the assigning of each of the groups is according to a multi-objective policy expressed via a GPP. Optionally, the GPP utilizes group-associated values and variables. The GPP may determine levels of importance (for example, when each level is infinitely more important than the one beneath), and within each level may be a weighing of the different factors and/or access parameters. Tradeoffs may be expressed with a GPP, such as between data consistency and data availability. The GPP constraints may be the overall available storage at each installation which puts a bound on the possible data storage assignments and replication factors for that installation. Other constraints may by monetary cost of storage, communication speed to the specific cloud installation(s) employed, duration of operations such as read(s) and write(s), and/or the like. As some access factors (e.g., cloud storage costs) may be non-linear, in general the GPP may involve linear programming, integer programming, constraint satisfaction problem solving, and/or the like.

Replication of data may be expressed by allowing blocks (blocks is another term for data objects highlighting the possibility that data objects may correspond to fixed size chunks of storage, but in this disclosure, they are a synonym for objects) to reside on more than one installation and taking into account classes of accesses (say from a certain region) and their frequency and latency. This may identify how many replicated blocks may be in each installation.

The data may be a collection of blocks. A block may be represented in the system as a tuple. A tuple is a synonym to a row in a relational database table. This representation may be chosen because in aspects of one embodiment a relational database may be used to store information about blocks (location(s), lock status, access parameters, group and more) and in this database, each block may be represented by a tuple (row of a relational table). This representation may be useful as the Structured Query Language (SQL) may perform bulk processing of tuples.

A block may be a complete file. A block may also be a component of a file, say of size 64 KB (other sizes may be possible). Each block may be associated with a block-key. This scheme may serve to store: a collection of files, a large key-value store, a large RDF knowledge base, a large graph, and/or the like. Access parameters may be assigned to blocks (or to whole files depending on the desired accuracy). When a collection of blocks stores a file, initially all these blocks may have the same access parameters. The same applies to a collection of blocks that store a table, a subset of table rows, a subset of table columns, and even a subrange of a table column.

In terms of standard data formats, the system may be intended to support flat files, relational table (traditional or columnar), NoSQL data, XML data, RDF data and the like. Generally, when a data format is to be distributed between corporate and cloud installation, the same system may be used in both locations. For example, when the data is conceptually relational, it may be kept in relational form on corporate servers in addition to on the cloud installation(s).

Data storage assignment module may comprise a mapper that associates access parameters based on predicates operating on the data scheme. The predicates indicate which portion of the data has certain access parameters values. The mapper associates these parameters to actual data blocks. Optionally, the mapper functionality is implemented via SQL queries.

For example, a hierarchal data collection of an Internet shop may comprise directory nodes that do not contain actual data, and data nodes that contain data (blocks, referred to herein as tuples that represent them in the system). For example, the directories and data may be organized according to geography. The customer addresses data file may have access parameters S=5, U=7, R=4, and F=5. The credit card data may be more sensitive, with parameters S=9, U=8, R=4, and F=4. The pending purchase data may have parameters S=3, U=4, R=2, and F=6. The completed purchase data may have parameters S=2, U=1, R=2, and F=1. In general, not all tuples in a data file (e.g., Customer credit cards) may have the same access parameters and such tuples may vary in their access parameters, and in addition they may be partitioned into groups of tuples based on their access parameters and tuples in a group may be uniformly treated in terms of replication and placement. Groups may also include tuples from more than one file (e.g., from Customer credit cards and from Customer addresses).

A user interface may be used to characterize the access parameters of the various data. The user interface may be used to express the constraints. An initial goal program policy GI may be derived and solved using a Linear Integer Programming (LIP) package (solver or ad-hoc solver and approximation packages). The solution may be used to create an initial data placement.

As times goes on, changes may take place and accesses may be monitored. The accesses may simply be counted regardless of the source of access, or, more precisely, also record the source of the access (geographically, by type of accessor, etc.) For example, new customers join and new purchases may be made, resulting in data accesses. In addition, statistics of usability and actual performance may be collected. These statistics may be used to tune the access parameters of files and blocks in addition to the communication cost parameters in GI. Further, cost structures may change which affects GI's constants. The result may be a modified goal program policy GPP1. This goal program policy may be evaluated and the result may indicate a new placement assignment (NPA). When determined to be overall beneficial, a NPA transition may be implemented, usually in background mode while the system continues processing applications, to transform the current data placement into a new one. So, storage may be re-arranged dynamically.

A number of system embodiments may have aspects constructed based on the technology described herein. For example, a system may be implemented in a Unix operating system environment. Following are non-exclusive examples:

System 1: This may be a placement production tool. It may take as input the various parameters and constraints and proposes a placement. It may operate by continuously reading updated parameters and adjusting placement accordingly. It may handle flat and XML files, Relational data, NoSQL data, and objects (most popular formats).

System 2: May augment System 1 with a program whose execution may perform initial data placement and apply placement changes when the system determines that such changes may be beneficial and the system carries them out. It may be tailored separately for each cloud platform.

System 3: A complete system with the capabilities of System 2, also including data movement tracking and statistics, cost-benefit analysis, a recovery component for handling communication problems and crashes, and/or the like.

Data may be organized in blocks. In the following example, distributing two files F1 and F2 with 100 and 210 blocks, respectively, may be considered. A corporate installation may hold 150 blocks and a cloud installation with unlimited capacity. The price of storage may be 0.2 per data block on the corporate installation and 0.15 on the cloud. A block in F1 may be accessed at frequency per second of 0.5, and of F2 at frequency 1.5. Data sensitivity may be on a scale of 1 (low) to 10 (high) and the desired average sensitivity on the cloud may be 7. The latency for block access may be 0.15 milliseconds (msec) in the corporate installation and 0.35 msec for cloud access. Given the accessors of the files, the desired latency for F1 may be 0.3 msec and for F2 0.2 msec. The desired average latency for any block may be 0.31 msec. X, Y denote the number of F1, respectively F2, blocks on the cloud. A budget may be 55.

Constraints may be:
$100+200-X-Y \leq 210$

Goals may be:
(budget) $0.15\ X+0.2\ (100-X)+0.15\ Y+0.2\ (200-Y)-d1^{+}+d1^{-}=55$
(average cloud sensitivity exposure) $10\ X+5\ Y-7\ X\ -7\ Y-d2^{+}+d2^{-}=0$
(average F1 latency) $0.5*0.35\ X+0.5*0.15\ (100-X)-d3^{+}+d3^{-}=100*0.31*0.5$
(average F2 latency) $1.5*0.35\ Y+1.5*0.15\ (100-Y)-d4^{+}+d4^{-}=200*0.31*1.5$
Level 1 minimization (budget+sensitivity exposure)
$d1^{+}+1.5\ d2^{+}$
Level 2 minimization (budget+sensitivity exposure)
$d3^{+}+d4^{+}$ A method and system to determine and affect electronic data blocks movement an initial assignment and subsequent modifications thereof, of data portions, to two or more storage locations based on corporate policy expressed as a mathematical program employing data and installation parameters may be described. Optionally, the mathematical program is a goal program policy elicited via a user interface operated on an electronic device or machine.

Optionally, the system continuously monitors the data parameters, and thereby induces changes to the mathematical program used for optimization. Optionally, monitoring includes recording the source of access. Optionally, the parameters may be associated to data by a mapper program interacting with humans. Optionally, the data portions to which parameters may be assigned/indicated via predicates. Optionally, predicates define the data portions the system may replicate. Optionally, the method includes assigning parameters to modified blocks based on their data constituents' blocks previous parameters. Optionally, the method includes assigning parameters to new blocks based on default parameters. Optionally, the replication is handled coarsely and data storage assignment of data blocks is based on overall data parameters. Optionally, the replication is handled for individual blocks or groups of blocks. Other intermediate levels of specifying replication may be possible.

Aspects of a system embodiment may determine an initial assignment and subsequent modifications thereof, of data portions, to two or more installations based on corporate policy expressed as a mathematical program employing data and installation parameters. Optionally, the system affects the actual movements of data blocks and ensures their consistent access. Optionally, the system performs continuous monitoring of data and installation parameters and affects changes to the goal program policy and its implied data blocks movements.

The disclosed techniques may assume the form of a system, a method, and/or a computer program product. The computer program product may include a computer readable storage medium (or media) having computer readable program instructions thereon for causing a processor to carry out aspects of embodiments.

The computer readable storage medium may be a non-transitory, tangible device that may retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

A hardware or software loader may download computer readable program instructions described herein to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some aspects of some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of embodiments.

Aspects of embodiments may be described herein with reference to flowchart illustrations and/or block diagrams of methods, apparatus (systems), and computer program products according to aspects of embodiments. It may be understood that each block of the flowchart illustrations and/or block diagrams, and combinations of blocks in the flowchart illustrations and/or block diagrams, may be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that may direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It may also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

A system may consist of sites. A site may be local, that may reside on a corporate data center, or cloud resident, usually a data center (public or private). Application data resides on local and cloud sites. Application instances may run at a local site, a cloud site or in a split mode in which the instance has a local component and a cloud component. Local sites may be dented as L1, L2, . . . and cloud sites as C1, C2, . . . .

The goal of the system may be to process calls to applications in accordance with corporate policy. The policy may be expressed mathematically via a formal description called a goal program policy (GPP). A mixed linear-integer program organized in levels of importance may be used. Each level may be associated with an objective function to be minimized.

The business entities may be tuples (standing for objects, or tuples). Each tuple may be associated with data and S, U, R, F parameters. There may be additional tuple fields (columns) that reflect tuple accesses and intermediate values. The S, U, R parameters may be set by management rules for each tuple:

S denotes the security level (1-10). There may be a rule setting S based on activity (e.g., high value deals). The rule may be static based on a classification ("gold traveler").

U denotes the desired response time for an app involving this object. There may be a rule for setting U.

R denotes the replication level (1-10). The rule may be static based on a classification (e.g., "platinum traveler").

F denotes a measured quantity, the number of times per hour that this object has been accessed.

The range 1-10 is a practical choice shown as an example, and other values may also be acceptable.

Such settings may be manually or programmatically overridden. The system has applications (apps) denoted by APP1, APP2, etc. When launched, the operational entities are said to be application instances. There may be 4 modes of running the system and one needs to indicate which mode may be chosen.

1. Application instances may be each statically assigned to either some cloud site Cj or some local site Lk. There may be no site change later on.
2. A dynamic application starts at either at some Lj or at some Ck but later on it may change site based on whether it accessed overall more data at some other site or it may be beneficial to move it in terms of communication costs.
3. BOTH mode: an application instance APPi starts BOTH at C and L (the subscript indicating the precise site may be ignored). Denote the parts APPiL and APPiC. APPiL accesses data locally, APPiC accesses cloud data. APPiL and APPiC exchange values of variables relevant for the operation. So, after each such exchange XPPiL and APPiC may be at identical computation states. The one that "moves forward" may be the one whose next needed data may be cheaper to obtain.
4. A mixed mode in which each Application instance may be individually set to static, dynamic or BOTH.

When operating in a BOTH mode, an application, instead of running on a single processor as is performed usually, operates on multiple processors in parallel. Optionally, the storing of each of the data objects is performed in parallel to regular system activity. Usually, an application may access data objects in its vicinity and in other locations but the application state is maintained in one processor and even when an application is executed on multiple processors, such as in parallel computing, the various processors are executing different functions or accessing different data. In the BOTH mode, the same identical application state is maintained in two or more processors at different locations. These instances are clones of the same executing application. When an instance of the application changes state in one place, for example, variables of the application change their assigned values, the change is communicated to the other clone instances. At each point of time, one clone is in control. The advantage may be that when the application program needs to access data, it may transfer control to the clone with the fastest/least expensive access to the data, rather than transporting the data over the network, which cause overheads in time, cost, network congestion, and/or the like. The overhead of making sure that the program state is the same on the various clones may be much less than moving the data over the network.

Optionally, a method comprising running two or more clone instances of an identical application, each of the clone instances at one of two or more hardware processors. The method comprises an action of sharing program states between the hardware processors, such that the clone instances are effectively executing the same processor instruction of a program code defining the identical application. The method comprises an action of selecting one of the clone instances for accessing data, wherein the selected clone instance comprises a fastest, least expensive, and/or closest access to at least one data object. The method comprises an action of executing one or more processor instructions by the selected clone instance to access the one or more of the data objects. The method comprises an action of sharing the results of the executing between the hardware processors.

Optionally, a system comprising two or more hardware processors, and two or more storage locations. Each storage location comprising one or more of two or more non-transitory computer readable mediums, wherein the non-transitory computer readable mediums comprise two or more data objects. One or more of the non-transitory computer readable mediums comprises program code executable on the hardware processors. The program code is configured to run two or more clone instances of an identical application defined by the program code, each of the clone instances at one of the hardware processors. The program code is configured to share program states between the hardware processors, such that the clone instances are effectively executing the same processor instruction of the program code. The program code is configured to select one of the clone instances for accessing data, wherein the selected clone instance comprises a fastest, least expensive, and/or closest access to one or more of the data objects. The program code is configured to execute one or more processor instruction by the selected clone instance to access the one or more of the data objects. The program code is configured to share the results of the executing between the hardware processors.

Optionally, a computer program product, the computer program product comprising a processor-attached non-transitory computer-readable storage medium having program code embodied therewith. The program code executable by two or more hardware processors to run two or more clone instances of an identical application defined by the program code, each of the clone instances at one of the hardware processors. The program code executable by two or more hardware processors to share program states between the hardware processors, such that the clone instances are effectively executing the same processor instruction of the program code. The program code executable by two or more hardware processors to select one of the clone instances for accessing data, wherein the selected clone instance comprises a fastest, least expensive, and/or closest access to one or more of two or more data objects. The program code executable by two or more hardware processors to execute one or more processor instructions by the selected clone instance to access the at least one of the data objects. The program code executable by two or more hardware processors to share the results of the executing between the hardware processors.

Corporate policy may be expressed with a goal program policy (GPP) defined in terms of:
1. access parameters.
2. Budget allotted (may be totally spent).
3. Storage needs.
4. Storage capacities.
5. Storage costs.
6. The tradeoffs involving all of the above.

Accesses to data may be probabilistically monitored. This determines the recorded F value per tuple. Accesses may be also monitored per each application instance, per each Li and per each Cj sites. Data placement may be initially determined to best satisfy the GPP. Every so often, the GPP may be evaluated again based on current system parameters. Let the results be d1, ..., dn. The average da of d1, ..., dn defines the system performance. In calculating da, the current up-to-date values of access parameters may be used.

There may be a fixed number of groups of tuples, Say G1, ..., Gk. Each tuple represents a data object. Each tuple may be assigned to a group based on its access parameters. Tuple size in KB may be a factor in group membership determination. The tuples in a group may be stored together and when relevant may also be replicated together. For example, suppose there is no replication, all tuples in a particular group may be either stored at some site Li or they may be all stored together in some site Cj; in other words, all tuples in a group have the same storage behavior. Further, when replication is applied to a tuple in a group, the same replication applies to all tuples in a group. This 'move together' behavior of objects represented by tuples in a group of tuples simplifies system operations and optimization. It also implies that groups may be defined in such a way that their tuples may 'resemble' each other. Combinatorially, one may define up to 10,000 groups but such a large number may make group handling too expensive and a balance may be struck. There may be a small number of groups that may greatly simplify management and may make optimization feasible.

The system includes a number of directories:
a. Group directory: indicates for each group its replication sites and its tuples.
b. Tuple directory: indicates for each tuple its current group, optionally its new group (during transitions), and its lock bit when the site may be primary (see below) for this tuple's group, tuple parameters including S, U, R and F. Optionally, a locking mechanism on tuple is employed to control the storing of some of the data objects to new locations.

The directories may be recoded in relational tables and accessed via SQL; other options may be possible. The directories may be replicated in all active sites. For each group, a specific site may be declared as the primary site.

When every so often the GPP is re-evaluated, this may also cause changes in data placement. This may be done when (a) such change of placement may be more beneficial by at least u % (u denotes a system parameter) from the current placement and (b) the cost of such a change may be acceptable. As the cost of movement of data may be primarily that of communication, the total expected cost of effecting the change may be calculated. This cost may be less than ALPHA*(percentage improvement in GPP)*(total communication costs of the system since the last placement change). This criterion compares apples to apples (communication costs) and trades it with percentage GPP improvement. As time goes on it becomes more probable to make a change as the communication cost rate in the future may be expected to roughly follow the trends of the past. The parameter ALPHA may be 1, less than 1, when the current trend may be that communication is stable or decreasing, or larger than 1 when the trend is increasing communication. Other similar decision criteria for data reorganization decision may be possible. In fact, one may incorporate the communication costs in the GPP and the solution may be feasible only when the abovementioned improvement may be achieved as outlined below.

Data re-placement may be optionally realized as follows:
a. Take the current groups and tuples and applies the GPP to determine optimal locations regardless of the current tuple locations. This may introduce a high communication cost but may be relatively simple to formulate as a GPP.
b. As in the previous item but also take into account the current locations of tuples so as to not exceed allowed communication cost in obtaining the new placement. This may avoid a good new placement which may be too expensive to obtain; this may effectively delay re-organization and perform it when it's clearly due.

In execution:
1. Decide on the number of application instances per application. For each application instance, decide on the APP mode—1, 2, 3 or 4 and its working characteristic (which data, what access mode etc.).
2. Load the system with initial configuration parameters.
3. Read in the GPP template from a file or construct it dynamically.
4. Execute the GPP to obtain an optimal initial placement.
5. Perform an initial placement of the data.
6. Execute the system, namely apps, on demand:
   a. Activate application instances, collect access data, and update data tuples with both application-related updates in addition to performance bookkeeping ones.
   b. Every so often, check the GPP value based on current data placement and up-to-date access parameter values. Check also the optimal GPP value allowing for alternative locations.
   c. when there is a "sufficient GPP improvement" and the predicted cost is 'reasonable', re-place the data as follows:

i. Replacement may be done in parallel to regular activity.
ii. Data movement may be done in groups or sub-groups (fractions of groups). The sub-group size determines the number of tuples that may be temporarily inaccessible (being in transit).
iii. Before moving a tuple it may be 'locked' (by setting its lock bit).
iv. A tuple becomes accessible once the sub-group or group movement may be complete. Being operational may be entailed by removing the 'lock'. The moved tuple may be now part of a new group. When the lock is released the tuple may be accessible as may be the corresponding object in the new location (or locations).
v. when the size of the sub-group being moved may be large, this may freeze some system operations, those operations needing a locked tuple, for a short duration.

accessed tuples and that this locking may be global. So, when an app terminates and returns an answer it updates all replicas and only when all copies of tuple X are updated, the lock on X may be released.

The paper "A Taxonomy of Partitioned Replicated Cloud-based Database Systems", by Divy Agrawal, Amr El Abbadi, Kenneth Salem, presents basic techniques and ways to think about this replica update problem.

The values used in the formulation of the GPP may be group related. This makes the problems more manageable as the number of groups may be usually smaller than the number of objects (tuples). These values may be assigned to GPP variables, deviation variables or used in constraints. So, the number of such variables may be determined by the number of groups. For example, following is the case of 2 groups, GI and G2 (had there been more groups, each one may account for one additional line in the table). The following table displays the variable names and their 'meaning'.

| Group | Size in KB | Average S value for group tuple (rule determined) | Average U value for group tuple (rule determined) | Average R value for group tuple (rule determined) | Computed average F value for group tuple | Size at Locations (Assume L1, L2, C1, C2). |
|---|---|---|---|---|---|---|
| G1 | G1.sz | G1.S | G1.U | G1.R | G1.F | G1.L1<br>G1.L2<br>G1.C1<br>G1.C2 |
| G2 | G2.sz | G2.SZ | G2.U | G2.R | G2.F | G2.L1<br>G2.L2<br>G2.C1<br>G2.C2 | vi. For a moved tuple, its new group may be indicated in the tuple directory. This enables locating a tuple during rearrangement.
vii. When all tuples of all old groups may be handled, the new groups become the current groups and the group directory may be updated. At this point information regarding old group may be deleted.
d. Collect statistical data, reflecting system operations, in the log.
7. Periodically, use the log data to derive statistics concerning GPP along the way in addition to total run time, total accesses, total communication time and similar relevant statistics.

When accessing a data object c it may be likely to access a data object b, it makes sense to put them in physical proximity. This effect may be a natural consequence of the operation of the system. Statistics may be collected and when the probability of co-access of objects may be high, b may be moved to co-locate with c in the same group. This may be an alternative "light weight" system or working in parallel and independently of the GPP based system. There is thus a possibility to move a tuple from its current group to another, with which it shows greater affinity, in parallel to system operations (using the locking mechanism). See also Chapter 8 in the book by Bernstein et al.: Concurrency Control and Recovery in Database Systems, Addison-Wesley Longman Publishing Co., Inc. Boston, Mass., USA, 1987, ISBN:0-201-10715-5.

Replicas may enable close-by access and thereby reduce response time. An issue may be replica updates, such as when one copy may be updated by an App, when and how the other replicas are updated. Applications may lock In formulating GPPs, the main difference between evaluating 'current GPP value' and 'optimal GPP value' may be that in the former the Size at locations variables may be assigned their current value (as hard constraints) whereas in the latter these variables may be freely assigned any (within the constraints) value.

The system may be a software tool whose function may be to assess the usefulness of the proposed optimized dynamic data distribution method. The system may be written in C++/Java or another programming language and it utilizes an SQL Engine (Postgres or MySQL for example) and a Linear/Integer optimization package (Lindo API or GUROBI OPTIMIZER engines). This enables ease of implementation, for example, a rule is simply an SQL query.

The operation considers two data storage areas Cloud and Local. Each may be associated with a number of sites C1, . . . , Ck for Cloud and L1, . . . , Lu for Local, each site has a capacity in Megabytes, denoted Ci.c or Lj.c. Intuitively, each cloud site may be a data center and each local site may be a corporate data center.

The data may be objects, where each object may be represented by a tuple in a relational table for handling the represented object during operation. The objects that may be manipulated may be associated with on-line applications, e.g. like a shop, Amazon style. Each object has related applications, for example commerce related attributes (fields or columns), operation related attributes and attributes related to SURF and similar access parameters.

Object activity, in addition to other parameters, e.g., the class of an object, determine the object's access parameters via rules. An alternative may be manual set-up based on GUI or script files. Each rule may be designed to associate access parameters to an object, based on the object's other parameters. An example rule: sales over last 12 months PERIOD>1000 AND customerClass>3 THEN U=5. Rules may be expressed via SQL queries. The above rule may be written as:
 UPDATE customerTable
 SET U=5
 WHERE last12MonthsPeriodSales>1000 AND customerClass>3

Based on the access parameters and possibly other parameters, the set of objects may be partitioned into groups and the objects of each group may be stored together (once, or replicated). So a group may be a logical concept which translate into physical placement. Groups may be formed and may be statically defined via rules based on the access parameters, i.e., such as not change the group definition. Still, as time goes on a tuple may change its group membership due to access parameters changes. A group for a tuple may be defined via a SQL query. An alternative may be manual set-up based on GUI or script files.

One example for the definition of groups and the associated queries may denote ranges as: L=0, 1, 2 M=3, 4, 5, 6, 7 H=8, 9, 10

Two groups (group assignment may be based only on F) are illustrated in FIG. 3.
To set the group number to say Customer tuples:
Update customer
Set newGRP=1
Where (F<8)
Update customer
Set newGRP=2
Where (F>7)

A larger number of 18 groups is illustrated in FIG. 4, in which the way a user may define groups is presented. For example, the query for defining group 13 follows.
Update customer
Set newGRP=13
Where (7<S<11) AND (U<7) AND (R<11) AND (F<3)

The system activates applications APPi, etc. that perform object accesses and updates. Each application has a unique name. Each application has a function (Class) A that implements it. Each application instance may be associated with a mode of operation (1-4) indicating whether it may be local, cloud, dynamic of BOTH, type application instance. When an application has a number of instances, each one may be regarded as a separate application, although they may have identical code.

A succinct directory relation indicates for each object (tuple) its primary current location (in case there are replicated copies, one may be declared to be primary). Conceptually the directory may be replicated in each site to enable application instances to ascertain where tuples may be located. In addition, each directory entry may be associated with a lock-bit. This bit may be essentially a latch used during the tuple movement. When this bit may be set (to 1) the object may not be accessed (read or written).

Every so often, a desired new data placement may be indicated. There may be two basic ways to create a new placement. One may be to "freeze" operations and move each object to the location determined for its current group by the optimization. Another, more desirable option may be to allow the system to continue operating and move objects while the system operates normally.

Following may be a second approach, where for each new group (or a fraction of a group), where the lock-bit may be set on the group's tuples and move each tuple from its current location(s) to the new ones, update the directory and reset the lock-bit (to 0). This way, the system may continue operation in parallel to object movements. The locking/moving for smaller groups of tuples (by using the natural order implied by tuple IDs to determine the fraction to move) may be done. Another possible technique, use 2 sets of group numbers by which to identify groups. When a tuple may be moved its new group may be always in the 'other' group of numbers.

The goal program policy may be essentially a sequence of "ordinary" mixed integer-linear optimization problems, where each successive problem provides fixed values (variables bindings to values) for some variables for the subsequent problem (usually there are 1-3 such problems, or levels).

Tools (solvers) to be used include LINDO API or the GUROBI OPTIMIZER, both support C, C++ and Java. A goal program policy may be easily specified within the APIs presented by these tools. The APIs contain commands for presenting the problem to the solver and for obtaining solutions.

A GPP may be exhibited in a simplified scenario. Consider the following scenario in which there may be 2 groups "group 1" and "group 2", think of group 1 as L1 and group 2 as C1, and no replication:
 Data may be organized in blocks, 4 KB each. Two tables F1 and F2 with a 100 and 210 blocks, respectively, may be distributed.
 An installation may hold 150 blocks and a cloud installation with unlimited capacity.
 The price of storage may be 0.2 per data block on the corporate installation and 0.15 on the cloud. A block in F1 may be accessed at frequency per second of 0.5, and of F2 at frequency 1.5.
 Data sensitivity may be on a scale of 1 (low) to 10 (high) and the desired average sensitivity on the cloud may be 7.
 The latency for block access may be 0.15 msec. in the corporate installation and 0.35 msec. for cloud access.
 Given the accessors of the files, the desired latency for F1 may be 0.3 msec. and for F2 0.2 msec. The desired average latency for any block may be 0.31 msec.
 X, Y denote the number of F1, respectively F2, blocks on the cloud ("group 1"). A budget of 55 blocks may be in cloud storage.
The GPP is:
 Level 1 minimization (budget+sensitivity exposure, "first problem" obtaining values for $d1^+$ and $d2^+$):
  $d1^+ + 1.5\ d2^+$
 Level 2 minimization (budget+sensitivity exposure+latency, "second problem" using the obtained values for $d1^+$ and $d2^+$ obtaining values for all other variables):
  $d3^+ + d4^+$
 Goals:
  (budget) $0.15\ X + 0.2\ (100-X) + 0.15\ Y + 0.2\ (200-Y) - d1^+ + d1^- = 55$
  (average cloud sensitivity exposure) $10\ X + 5\ Y - 7\ X - 7\ Y - d2^+ + d2^- = 0$
  (average F1 latency) $0.5*0.35\ X + 0.5*0.15\ (100-X) - d3^+ + d3^- = 100*0.31*0.5$
  (average F2 latency) $1.5*0.35\ Y + 1.5*0.15\ (100-Y) - d4^+ + d4^- = 200*0.31*1.5$
 Constraints:
  $100 + 200 - X - Y \leq 210$
  $d1^+, d1^-, d2^+, d2^-, d3^+, d3^-, d4^+, d4^- \geq 0$
 There may be another issue to consider. The GPP above does not take into account the cost of moving data to a new location. Basically, at this point, data tuples may be residing in certain locations (based on their current group membership). Each group may have a current percentage at each site. So level 3 optimization may come up with updated locations that minimize data movement cost. This may be minimization of another set of deviation variables. The end result may identify the desired X and Y.

There may be 2 options for maintaining the log: as a sequential file or as a table LOG. Initially the table option may be used, and when there are performance issues the file option may be used. The LOG table columns are:

Lsn: long, log sequence number, a running number 1, 2, . . . .

eventTime: long, It may be also possible to implement a solver from scratch and integrate the solver into the system software.

operationCode: int, there may be operation codes 1, 2, 3, . . . , corresponding to event types (detailed below) such as a tuple read, tuple write, tuple move etc.

locationCode: string, one of C1, . . . , C5 L1, . . . , L5 (could be extended in the future)

tableCode: string, one of cu, pr, of, ca, ad, gL, cuL, prL, ofL, caL, adL namely an abbreviation for the table name, pr means product and prL means product locator table, similarly for the other tables.

columnName: string, name of affected column or NULL oldValue: string, the old value in string format newValue: the new value in string format, may be NULL commTime: float, communication cost of logged operation, may be NULL newLocation: new location for tuple, may be NULL The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   operating a computerized system for optimized data distribution, the computerized system having access to a computer network comprising a plurality of non-transitory computer readable storage medium locations, to:
   receive, by a database access manager module of the computerized system, wherein the database access manager comprises processor instructions configured for receiving a database, a database comprising a plurality of data objects and a plurality of data storage addresses, wherein each data storage address directs to one of the plurality of non-transitory computer readable storage medium locations;
   compute, by a parameter assigner module of the computerized system, wherein the parameter assigner module comprises processor instructions configured for computing parameter values of said data objects of the received database, a plurality of parameter values for each of the plurality of data objects, wherein the computing of the plurality of parameters is based on rules expressed in a database language;
   group, by the parameter assigner module, the plurality of data objects based on the plurality of parameter values and a plurality of predefined rules, thereby producing a plurality of groups, wherein the groping is based on rules expressed in a database language;
   assign, by a database movement module of the computerized system, wherein the database movement module comprises processor instructions configured to assign said data objects to said data storage addresses based on the parameter values, each of the plurality of groups to one of the plurality of data storage addresses based on the plurality of predefined rules; and
   access said computer network, to store, by said database movement module, each of the plurality of the objects of the groups at one of the plurality of non-transitory computer readable storage medium locations based on the assigning.

2. The method of claim 1, further comprising receiving a plurality of user parameter values from a user interface of a client terminal, wherein the plurality of user parameter values are assigned to the plurality of data objects, and wherein the grouping is further based on the plurality of user entered parameter values.

3. The method of claim 1, further comprising monitoring the values of the plurality of data objects and characteristics of the local and cloud-based locations for a system parameter-exceeding change, and when the change is detected repeating the steps of computing, grouping, assigning, and storing.

4. The method of claim 1, further comprising monitoring the values of the plurality of data objects for a change, and when the change is detected repeating the steps of computing, grouping, assigning, and storing.

5. The method of claim 1, wherein the plurality of parameter values are associated with the plurality of data objects based on interaction between users and the plurality of data objects.

6. The method of claim 1, wherein at least one of the plurality of data objects is replicated to at least two of the plurality of non-transitory computer readable storage medium locations.

7. The method of claim 1, further comprising assigning each of the plurality of groups to one of the plurality of data storage addresses based on a financial cost of at least one of storage and communication at the respective data storage address.

8. The method of claim 7, wherein the assigning of the plurality of data objects is performed periodically.

9. The method of claim 8, wherein the assigning is conditioned on comparing at least one of the plurality of parameter values to at least one corresponding threshold value.

10. The method of claim 1, wherein the grouping is based on a k-means clustering of the plurality of parameter values.

11. The method of claim 1, wherein each of the plurality of data objects is represented by a tuple in a relational database.

12. The method of claim 1, wherein said database language is Structured Query Language (SQL).

13. The method of claim 1, wherein the assigning of each of the plurality of groups is according to a multi-objective policy expressed via a Goal Program.

14. The method of claim 13, wherein the Goal Program utilizes group-associated values and variables.

15. The method of claim 1, wherein the storing of each of the plurality of data objects is performed in parallel to regular system activity.

16. The method of claim 15, wherein a tuple locking mechanism is employed to control the storing of some of the plurality of data objects to new locations.

17. A computerized system for optimized data distribution, the computerized system comprising:
   at least one hardware processor;
   a network interface to access a computer network comprising a plurality of non-transitory computer readable storage medium locations; and a processor-attached non-transitory computer-readable storage medium having program code embodied therewith, the program code executable by the at least one hardware processor to:
- receive, by a database access manager module of the computerized system, wherein the database access manager comprises processor instructions configured for receiving a database, a database comprising a plurality of data objects and a plurality of data storage addresses, wherein each data storage address directs to one of the plurality of non-transitory computer readable storage medium locations;
- compute, by a parameter assigner module of the computerized system, wherein the parameter assigner module comprises processor instructions configured for computing parameter values of said data objects of the received database, a plurality of parameter values for each of the plurality of data objects, wherein the computing of the plurality of parameters is based on rules expressed in a database language; group, by the parameter assigner module, the plurality of data objects based on the plurality of parameter values and a plurality of predefined rules, thereby producing a plurality of groups, wherein the groping is based on rules expressed in a database language;
- assign, by a database movement module of the computerized system, wherein the database movement module comprises processor instructions configured to assign said data objects to said data storage addresses based on the parameter values, each of the plurality of groups to one of the plurality of data storage addresses based on the plurality of predefined rules; and
- access, through said network interface, said computer network, to store each of the plurality of the objects of the groups at one of the plurality of non-transitory computer readable storage medium locations based on the assigning.

* * * * *